(12) United States Patent
Sato

(10) Patent No.: US 11,688,630 B2
(45) Date of Patent: Jun. 27, 2023

(54) SHALLOW TRENCH ISOLATION FILLING STRUCTURE IN SEMICONDUCTOR DEVICE

(71) Applicant: MICRON TECHNOLOGY, INC., Boise, ID (US)

(72) Inventor: Nobuyoshi Sato, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 17/202,079

(22) Filed: Mar. 15, 2021

(65) Prior Publication Data

US 2022/0293454 A1 Sep. 15, 2022

(51) Int. Cl.
*H01L 21/764* (2006.01)
*H01L 21/02* (2006.01)
*H01L 29/06* (2006.01)
*H10B 12/00* (2023.01)

(52) U.S. Cl.
CPC ...... *H01L 21/764* (2013.01); *H01L 21/02057* (2013.01); *H01L 29/0649* (2013.01); *H10B 12/033* (2023.02); *H10B 12/315* (2023.02)

(58) Field of Classification Search
CPC ............ H01L 21/764; H01L 21/02057; H01L 21/76224; H01L 29/0649; H10B 12/033; H10B 12/315
USPC ........................................................ 257/296
See application file for complete search history.

(56) References Cited

U.S. PATENT DOCUMENTS

| 8,835,268 B2 * | 9/2014 | Sudo ................. H01L 27/228 438/300 |
| 9,496,371 B1 * | 11/2016 | Arndt .................. H01L 21/3081 |
| 10,170,582 B1 * | 1/2019 | Belyansky ........ H01L 21/02181 |
| 2014/0225219 A1 * | 8/2014 | Huang ................. H01L 29/0649 438/424 |
| 2019/0355574 A1 * | 11/2019 | Kanno ............... H01L 21/67115 |

* cited by examiner

*Primary Examiner* — Dao H Nguyen
(74) *Attorney, Agent, or Firm* — Dorsey & Whitney LLP

(57) ABSTRACT

Disclosed herein are apparatuses and methods that include a shallow trench isolation filling structure. An example method includes: etching a semiconductor substrate to form a plurality of pillars and a trench therebetween; providing rinse solution in the trench; adding a plurality of insulating particles into the rinse solution; and removing the rinse solution such that the insulating particles and an air gap remains in the trench.

11 Claims, 9 Drawing Sheets

SHALLOW TRENCH ISOLATION FILLING STRUCTURE IN SEMICONDUCTOR DEVICE

BACKGROUND

The aspect ratio of trenches used for Shallow Trench Isolation (STI) is increased with downscaling of semiconductor devices. When the aspect ratio is increased, a problem occurs that adjacent ones of silicon pillars stick to each other due to surface tension of a rinse solution at the time of removing the rinse solution to dry the inner walls of the trenches after cleaning the inner walls, resulting in collapse of the silicon pillars. As a method of preventing this problem, a method of coating the inner walls of the trenches with a water repellent (such as a silylation agent) is known. However, the number of processes is increased when this method is used. In recent years, a drying process using a supercritical fluid having no surface tension is proposed. However, this method requires an expensive drying apparatus and is low in productivity, leading to an increase in the manufacturing cost.

DETAILED DESCRIPTION

Various embodiments of the present invention will be explained below in detail with reference to the accompanying drawings. The following detailed description refers to the accompanying drawings that show, by way of illustration, specific aspects, and embodiments in which the present invention may be practiced. These embodiments are described in sufficient detail to enable those skilled in the art to practice the present invention. Other embodiments may be utilized, and structural, logical, and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
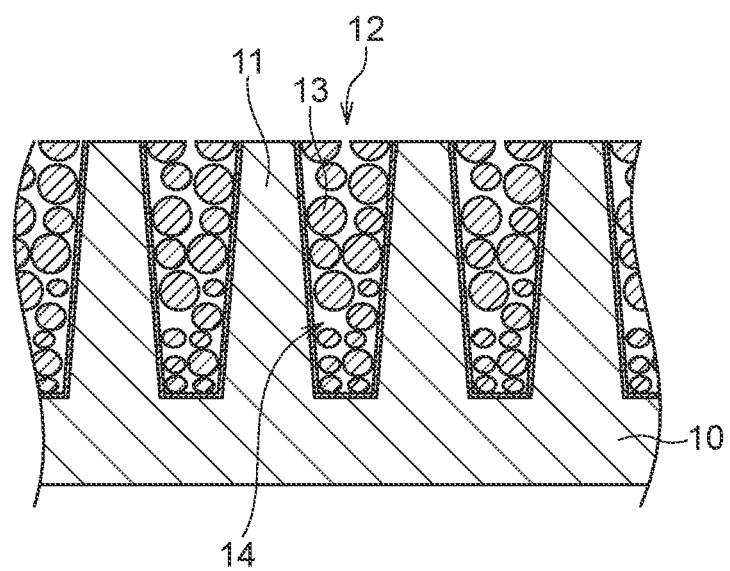
FIG. 1 is a schematic cross-section showing a structure of a semiconductor device according to an embodiment of the present disclosure.

As shown in FIG. 1, a semiconductor device according to the present disclosure includes a plurality of silicon pillars 11 provided on a semiconductor substrate 10 including silicon. The silicon pillars 11 are active regions being parts of the semiconductor substrate 10 and transistors are formed on the upper surfaces thereof. Trenches 12 formed between the silicon pillars 11 constitute ST1 regions. Silica particles 13 are embedded in the inner parts of the trenches 12. The inner parts of the trenches 12 are not completely filled with the silica particles 13 and air gaps 14 remain among the particles. Accordingly, a higher insulation property than in a general STI region that is filled with a silicon oxide or the like is obtained and the permittivity is significantly lowered. The sizes of the silica particles 13 can be selected according to the width of the trenches 12 and are, for example, 1 nm to 100 nm. It is preferable to use the silica particles 13 having a plurality of particle size distributions to more densely embed the silica particles 13 in the inner parts of the trenches 12. As an example, three kinds of the silica particles 13 having particle sizes of 1 nm, 3 nm, and 5 nm can be used. Since the silica particles 13 stick to each other and the silicon pillars 11 stick to the silica particles 13 in the trenches 12, the silica particles 13 remain in the inner parts of the trenches. 12.

Figure 2A:
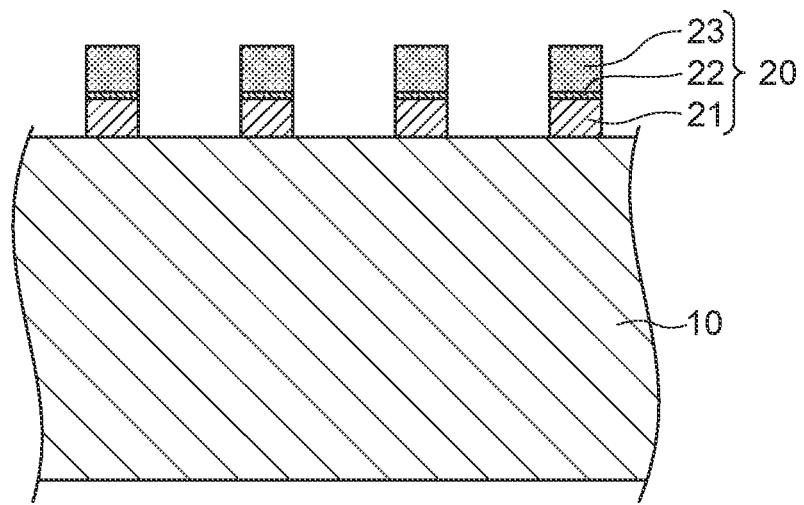
FIGS. 2A to 2E are process diagrams for explaining an example of a manufacturing method of the semiconductor device according to an embodiment of the present disclosure.
Figure 2B:
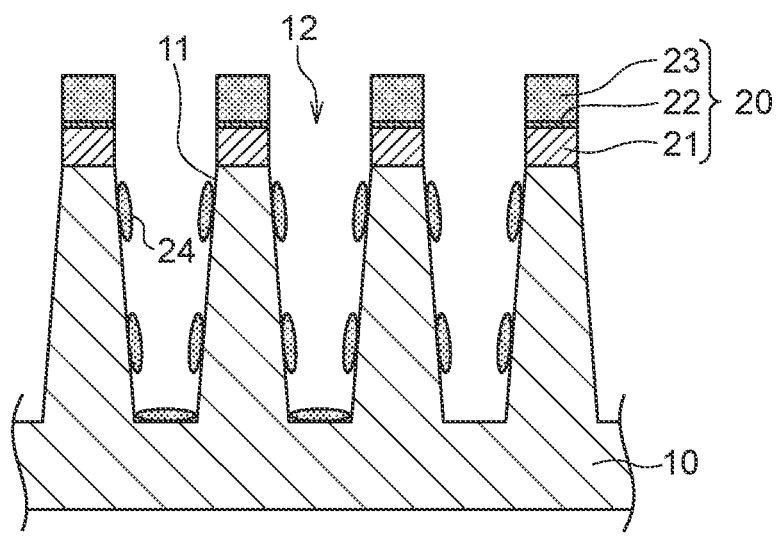

A manufacturing method of the semiconductor device shown in FIG. 1 is explained below. First, a plurality of mask patterns 20 are formed on a surface of the semiconductor substrate 10 as shown in FIG. 2A. The mask patterns 20 have a structure in which a silicon oxide film 21, a silicon nitride film 22, and a resist film 23 are stacked. Next, the semiconductor substrate 10 is dry-etched using the mask patterns 20 as a mask to form the trenches 12 on the semiconductor 10, as shown in FIG. 2B. The depth of the trenches 12 is, for example, 250 nm and the width of the trenches 12 on the bottoms is, for example, 15 nm. Parts of the semiconductor substrate 10 covered with the mask patterns 20 are the silicon pillars 11. When the trenches 12 are formed on the semiconductor substrate 10 by dry etching, polymer residues 24 adhere to the inner walls of the trenches 12. The polymer residues 24 are removed by a cleaning process.

Figure 2C:
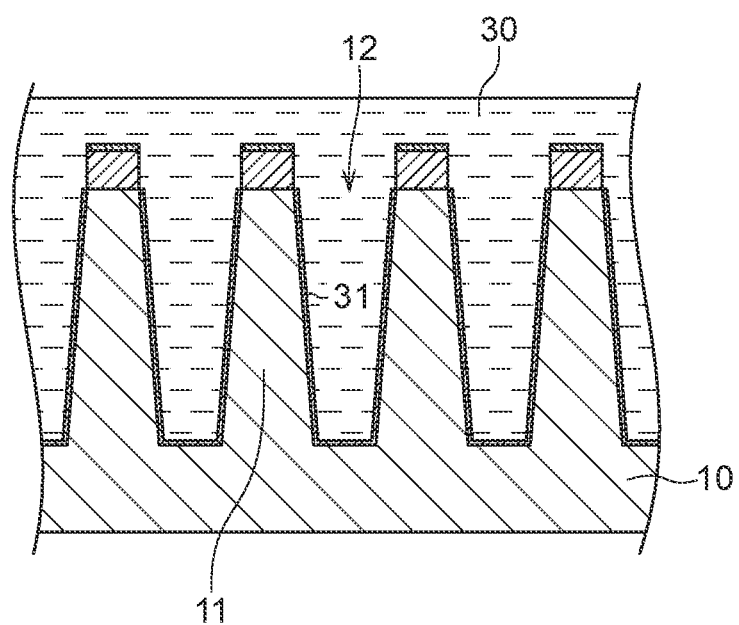

The cleaning process is performed by introducing a cleaning solution 30 including a hydrogen peroxide solution or the like into the inner parts of the trenches 12 as shown in FIG. 2C, after the resist film 23 is removed. Accordingly, the polymer residues 24 adhering to the inner walls of the trenches 12 are removed and a thin silicon oxide film 31 is formed on the inner walls of the trenches 12. In a general cleaning process, the cleaning solution including a hydrogen peroxide solution or the like is replaced with ultrapure water and is then further replaced with a rinse solution including isopropyl alcohol (IPA) or the like having a relatively-low surface tension, and the rinse solution is subsequently removed for drying. Also in this case, the silicon pillars 11 are at a risk of collapsing due to the surface tension of the rinse solution. Therefore, the inner walls of the trenches 12 need to be coated with a water repellent including a silylation agent or the like to prevent the rinse solution from adhering to the inner walls of the trenches 12. However, since the water repellent coating the inner walls of the trenches 12 subsequently needs to be removed, the number of processes increases.

Figure 2D:
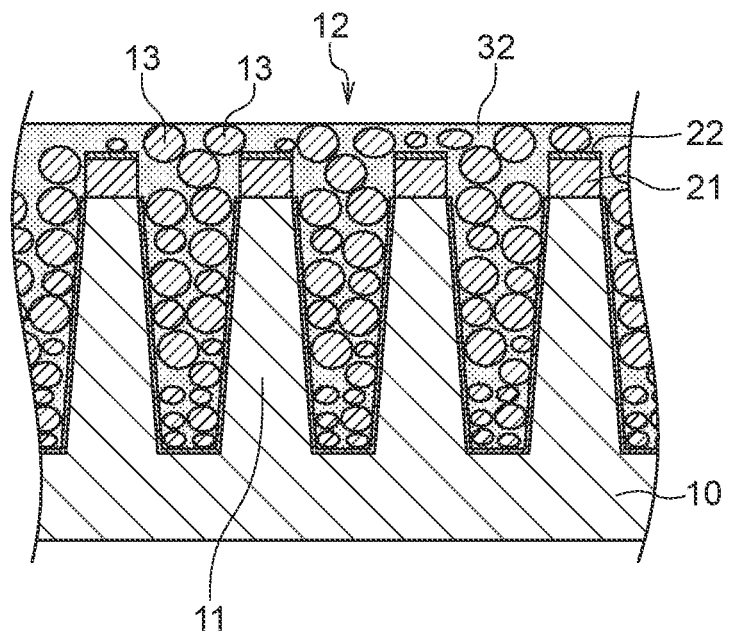
Figure 2E:
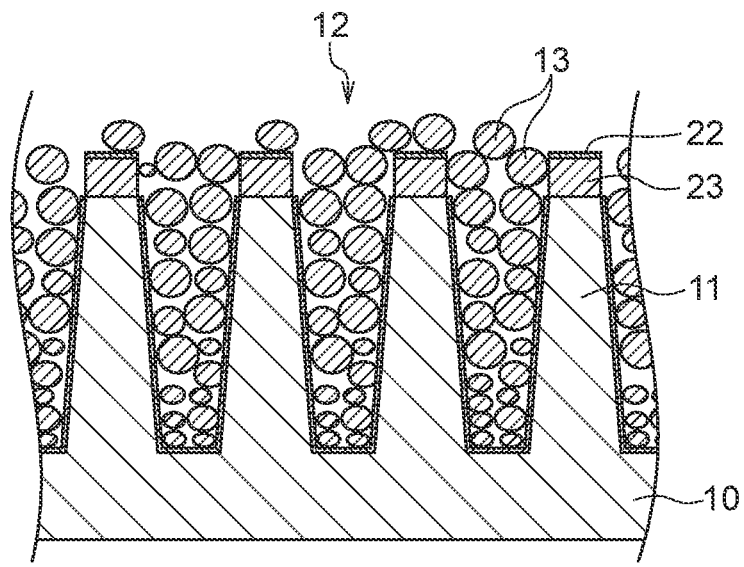

In the present embodiment, after the cleaning solution 30 is replaced with the rinse solution 32 and before the rinse solution 32 is removed, a solvent in which the silica particles 13 are dispersed is added into the rinse solution 32 as shown in FIG. 2D. For example, mixed powder including three kinds of the silica particles 13 having the particle sizes of 1 nm, 3 nm, and 5 nm, which are respectively mixed at the mixture ratio of 50%, 30%, and 20% (100% in total), is dispersed in a solvent and the resultant is added into the rinse solution 32. Accordingly, the silica particles 13 are mixed in with the rinse solution 32 and the silica particles 13 enter the inner parts of the trenches 12. The silica particles having small particle sizes easily enter narrow regions. Instead of using the solvent where the silica particles 13 are dispersed, TEOS or the like may be added into the rinse solution 32 to generate the silica particles 13 in the rinse solution 32 by a sol-gel method. In this case, the silica particles 13 include a cyclic polysiloxane. The rinse solution 32 is then removed as shown in FIG. 2E, whereby the STI regions are completed. The removal of the rinse solution 32 can be performed by vaporizing the rinse solution 32 by heating. Since no transistors are formed in the active areas at that time, the rinse solution 32 can be quickly vaporized by heating to a relatively high temperature, for example, 500° C. to 1000° C. Chemical mechanical polishing (CMP) is subsequently performed to remove unnecessary silica particles 13 and mask patterns 20, so that the structure shown in FIG. 1 is obtained.

As described above, the silica particles 13 are introduced during wet processing in the cleaning process of the trenches 12 in the present embodiment. Therefore, the silicon pillars 11 are supported by the silica particles 13 having entered the inner parts of the trenches 12. This prevents the silicon pillars 11 from collapsing at the time of removal of the rinse solution 32. Furthermore, the air gaps 14 are formed in the inner parts of the trenches 12 after the rinse solution 32 is removed, and accordingly a higher insulation property than in a general STI region can be obtained.

Figure 3A:
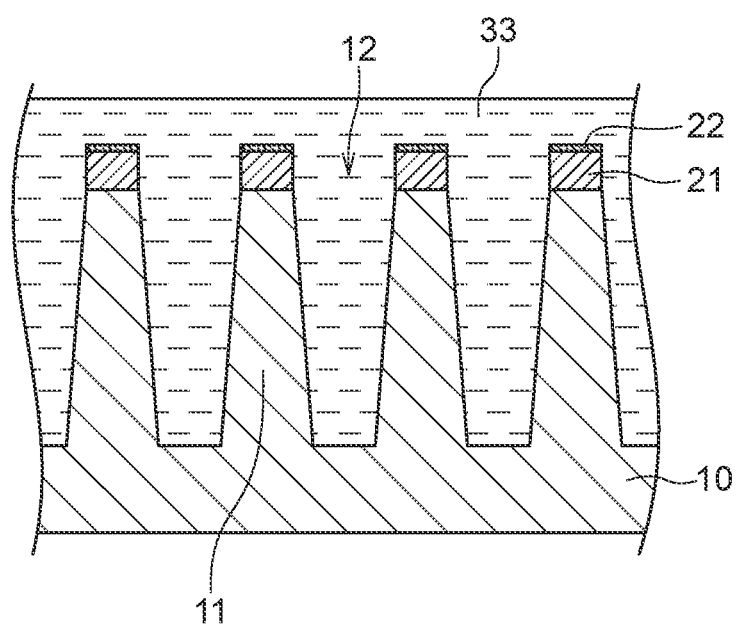
FIGS. 3A to 3C are process diagrams for explaining an example of the manufacturing method of the semiconductor device according to an embodiment of the present disclosure.
Figure 3B:
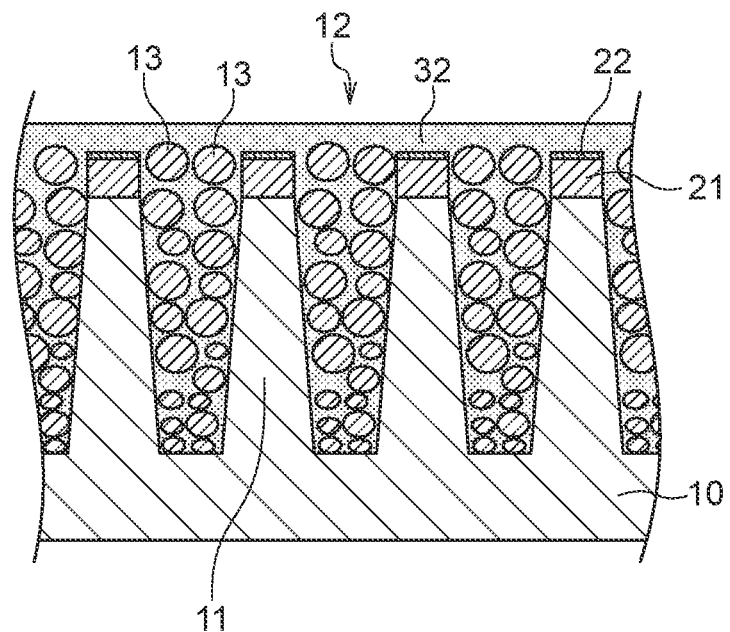
Figure 3C:
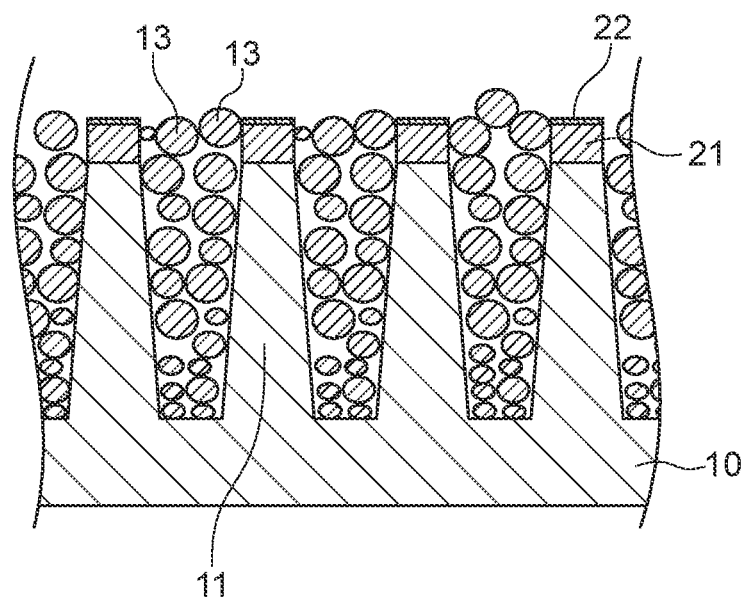
Figure 4:
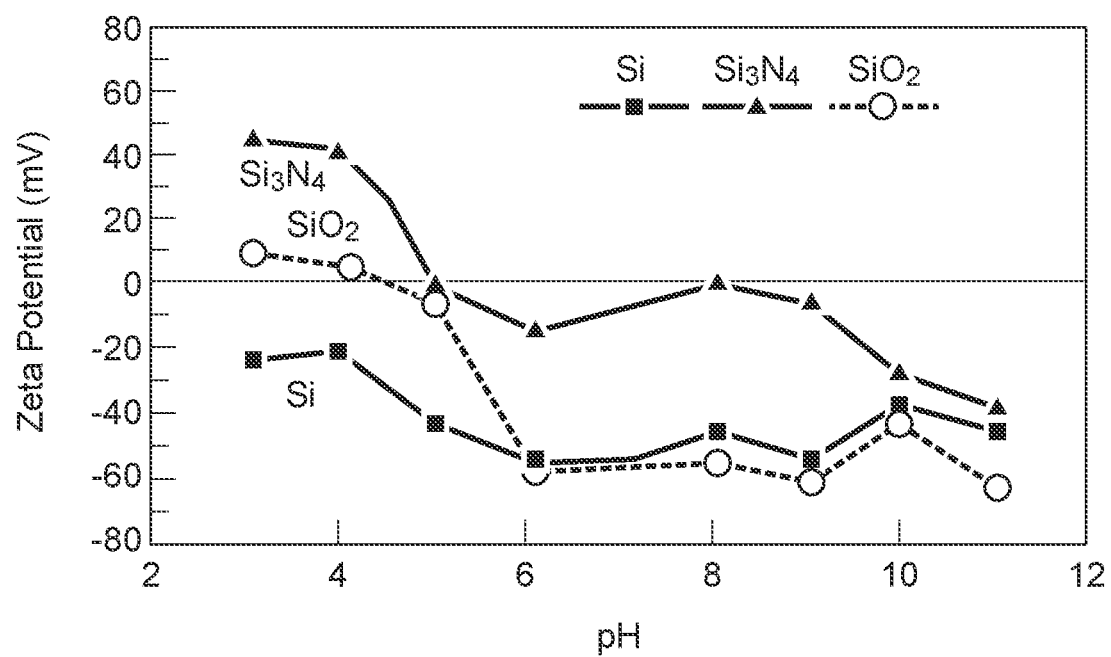
FIG. 4 is a graph showing a relation between pH levels of a solvent and zeta potentials an embodiment of the present disclosure.

In an embodiment of the present disclosure, the silicon oxide film 31 may be removed using a processing solution 33 including a dilute hydrofluoric acid as shown in FIG. 3A after the polymer residues 24 are removed using the cleaning solution 30 and before the silica particles 13 are added. When the silicon oxide film 31 formed on the inner walls of the trenches 12 is removed, the side surfaces of the silicon pillars 11 are exposed. At this time, the side surfaces of the silicon oxide film 21 are also slightly etched to an identical extent to the silicon oxide film 31. Next, the processing solution 33 is replaced with the rinse solution 32 and a solvent where the silica particles 13 are dispersed is subsequently added into the rinse solution 32 as shown in FIG. 3B. At this time, the pH level of the rinse solution 32 is preferably less than 7 and is more preferably in a range from 2 to 4. For example, there is a method of dissolving $CO_2$ in ultrapure water to lower the pH level. This is because zeta potentials of a silicon oxide and a silicon nitride in the rinse solution 32 are positive values as shown in FIG. 4 when the rinse solution 32 is acid. As a result, the silica particles 13 including a silicon oxide physically adsorb to the surfaces of the silicon pillars 11 having the zeta potential of a negative value. In contrast thereto, the zeta potential of the silicon nitride film 22 is a positive value and therefore the silica particles 13 are less likely to adhere to the surface of the silicon nitride film 22. That is, use of the acid rinse solution 32 enables the silica particles 13 to be led into the inner parts of the trenches 12. This phenomenon is effectively developed by adjustment of the pH level of the rinse solution 32 to the range from 2 to 4. When the rinse solution 32 is removed by heating as shown in FIG. 3C, the silica particles 13 chemically adsorb to the silicon pillars 11. Unnecessary silica particles 13 and mask patterns 20 are subsequently removed by the CMP, whereby the structure shown in FIG. 1 is obtained.

Figure 5:
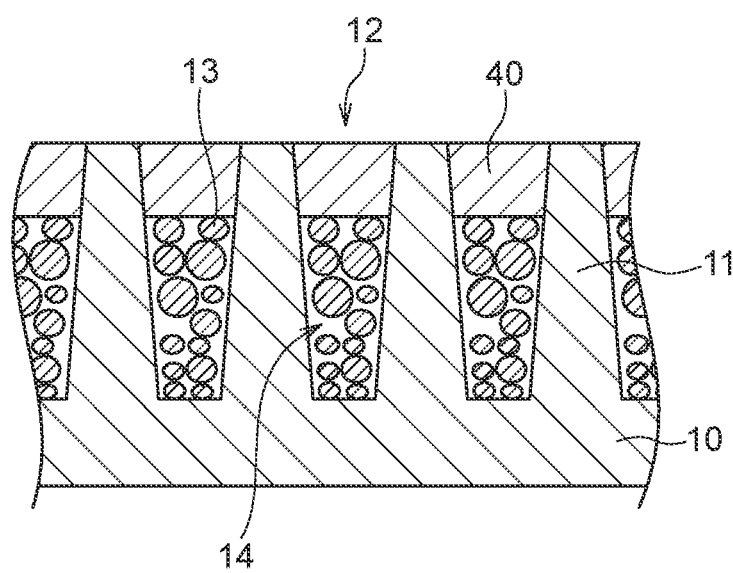
FIG. 5 is a schematic cross-section showing a structure of a semiconductor device according to an embodiment of the present disclosure including a first modification.

As shown in FIG. 5, in an embodiment of the present disclosure, the air gaps 14 may be capped by embedding the silica particles 13 in lower sections of the trenches 12 and filling upper sections of the trenches 12 with an insulating film 40 including a silicon oxide or the like. This prevents various materials such as a resist that are used in subsequent processes from penetrating into the air gaps 14. In order to obtain such a structure, it suffices to reduce the quantity of the silica particles 13 added into the rinse solution 32 or remove the silica particles 13 embedded in the upper sections of the trenches 12 by etching and subsequently form the insulting film 40 using a chemical vapor deposition (CVD) method or the like.

Figure 6:
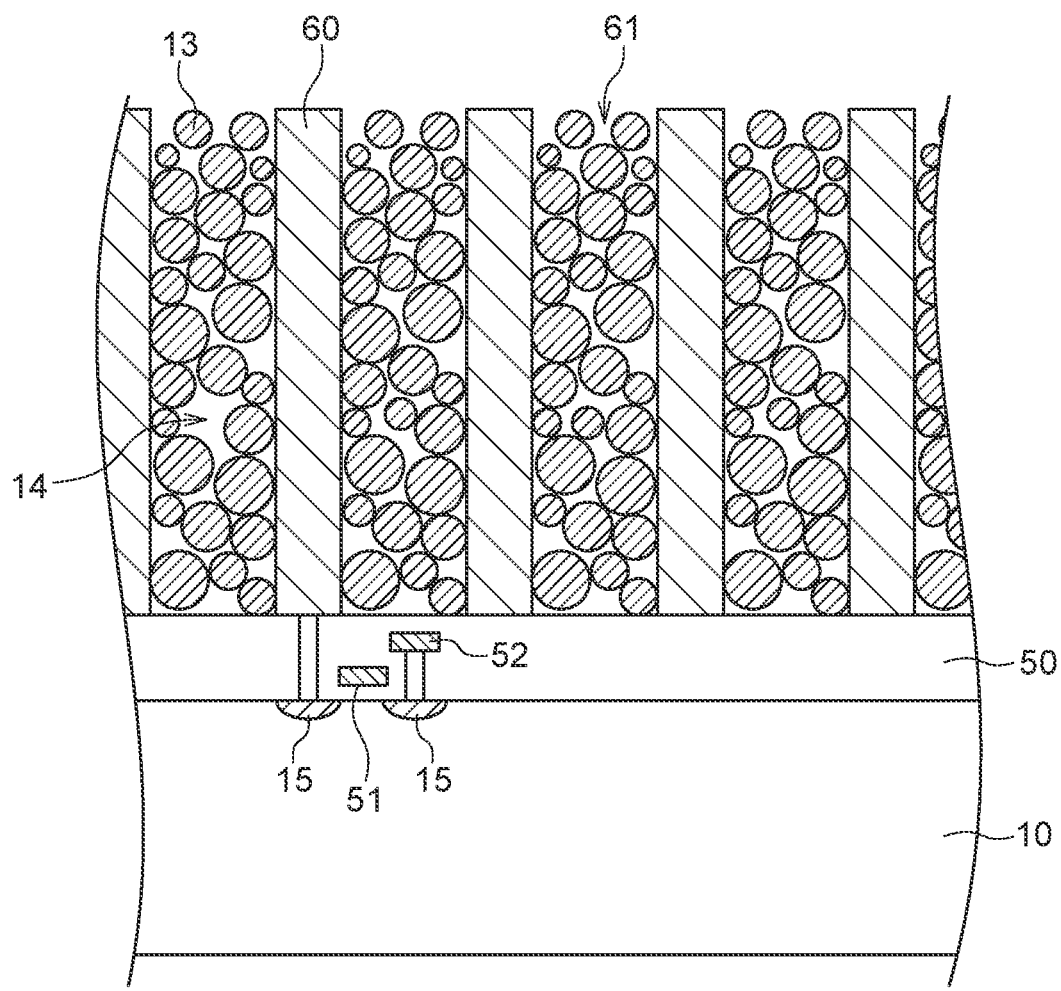
FIG. 6 is a schematic cross-section showing a structure of a semiconductor device according to an embodiment of the present disclosure including a second modification.

The trenches in which the silica particles 13 are embedded do not need to be formed by the silicon pillars 11 and may be formed by a pillar-shaped structure provided on the semiconductor substrate 10. In an embodiment of the present disclosure as shown in FIG. 6, a plurality of cell capacitors 60 are formed on the semiconductor substrate 10 with a wiring layer 50 interposed therebetween. A semiconductor device shown in FIG. 6 is a dynamic random access memory (DRAM). A gate electrode 51 of each of cell transistors, bit lines 52, and the like are formed on the wiring layer 50. Source/drain regions 15 of each of the cell transistors are formed on the semiconductor substrate 10. One of the source/drain regions 15 is coupled to a corresponding one of the bit lines 52 and the other of the source/drain regions 15 is coupled to a corresponding one of the cell capacitors 60. The cell capacitors 60 have, for example, a cylinder structure having a high aspect ratio and the pillar-shaped structure is formed by arraying many cell capacitors 60 at a predetermined pitch. Accordingly, trenches 61 having a high aspect ratio are formed between the cell capacitors 60. The silica particles 13 are embedded in the inner parts of the trenches 61. Embedding the silica particles 13 in the inner parts of the trenches 61 formed by the cell capacitors 60 in this way, collapse of the cell capacitors 60 can be prevented.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A method comprising:
   etching a semiconductor substrate to form a plurality of pillars and a trench therebetween;
   providing rinse solution in the trench;
   adding a plurality of insulating particles into the rinse solution; and
   removing the rinse solution such that the insulating particles and an air gap remains in the trench.

2. The method of claim 1, wherein the insulating particles comprise a silicon oxide.

3. The method of claim 2,
   wherein the semiconductor substrate comprises silicon, and
   wherein the method further comprises, before the adding, removing a silicon oxide film formed on an inner wall of the trench to expose a side surface of the pillars.

4. The method of claim 3, wherein a pH level of the rinse solution with the insulating particles is less than 7.

5. The method of claim 4, wherein a range of the pH level of the rinse solution with the insulating particles is in a range from 2 to 4.

6. The method of claim 4,
wherein the etching is performed by using a mask including a silicon nitride film, and
wherein the adding is performed with at least a part of the mask in which a top surface comprises the silicon nitride film remains.

7. The method of claim 1, wherein the adding is performed by a sol-gel method in the rinse solution.

8. The method of claim 1, further comprising filling an upper section of the trench with an insulating film after removing to cap the air gap formed in a lower section of the trench.

9. A method comprising:
forming a pillar-shaped structure on a semiconductor substrate, the pillar-shaped structure having a plurality of pillars to form a trench therebetween;
filling the trench by a solution with a plurality of insulating particles; and
removing the solution such that the insulating particles and an air gap remains in the trench.

10. The method of claim 9, wherein the insulating particles comprise a silicon oxide.

11. The method of claim 9, wherein each of the pillars is a cell capacitor of a DRAM cell.

* * * * *